(12) United States Patent
Hung et al.

(10) Patent No.: US 8,999,771 B2
(45) Date of Patent: Apr. 7, 2015

(54) PROTECTION LAYER FOR HALFTONE PROCESS OF THIRD METAL

(71) Applicant: Apple Inc., Cupertino, CA (US)

(72) Inventors: Ming-Chin Hung, Cupertino, CA (US); Byung Duk Yang, Cupertino, CA (US); Kyung Wook Kim, Cupertino, CA (US); Shih Chang Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/631,385

(22) Filed: Sep. 28, 2012

(65) Prior Publication Data

US 2014/0091390 A1    Apr. 3, 2014

(51) Int. Cl.
*H01L 21/335* (2006.01)
*H01L 21/768* (2006.01)
*H01L 27/12* (2006.01)

(52) U.S. Cl.
CPC .......... *H01L 21/768* (2013.01); *H01L 27/1248* (2013.01); *H01L 27/1288* (2013.01)

(58) Field of Classification Search
USPC ................... 257/213, 347; 438/142
See application file for complete search history.

(56) References Cited

U.S. PATENT DOCUMENTS

| | | |
|---|---|---|
| 4,080,619 A | 3/1978 | Suzuki |
| 4,958,205 A | 9/1990 | Takeda et al. |
| 5,075,237 A | 12/1991 | Wu |
| 5,642,129 A | 6/1997 | Zavracky et al. |
| 5,668,613 A | 9/1997 | Kim et al. |
| 5,698,902 A | 12/1997 | Uehara et al. |
| 5,721,155 A | 2/1998 | Lee |
| 5,990,492 A | 11/1999 | Kim et al. |
| 5,994,721 A | 11/1999 | Zhong et al. |
| 6,246,179 B1 | 6/2001 | Yamada |
| 6,372,636 B1 | 4/2002 | Chooi et al. |
| 6,406,928 B1 | 6/2002 | Jen |
| 6,479,398 B1 | 11/2002 | Chen, Jr. |
| 6,509,614 B1 | 1/2003 | Shih |
| 6,525,342 B2 | 2/2003 | Amemiya |
| 6,548,960 B2 | 4/2003 | Inukai |
| 6,613,620 B2 | 9/2003 | Fujimoto et al. |
| 6,686,273 B2 | 2/2004 | Hsu et al. |
| 6,768,531 B2 | 7/2004 | Ochiai et al. |
| 6,812,637 B2 | 11/2004 | Cok et al. |
| 6,967,407 B2 | 11/2005 | Otani et al. |
| 7,030,553 B2 | 4/2006 | Winters et al. |
| 7,045,406 B2 | 5/2006 | Huotari et al. |
| 7,129,634 B2 | 10/2006 | Boroson et al. |
| 7,190,419 B2 | 3/2007 | Park |
| 7,199,518 B2 | 4/2007 | Couillard |

(Continued)

FOREIGN PATENT DOCUMENTS

| | | |
|---|---|---|
| EP | 0376329 | 7/1990 |
| EP | 2048538 | 4/2009 |

(Continued)

*Primary Examiner* — David Vu
*Assistant Examiner* — Brandon Fox

(57) ABSTRACT

A thin-film transistor having a protection layer for a planarization layer. The protection layer prevents reduction of the planarization layer during an ashing process, thereby preventing the formation of a steeply tapered via hole through the planarization layer. In this manner, the via hole may be coated with a conductive element that may serve as a conductive path between a common electrode and the drain of the transistor.

10 Claims, 10 Drawing Sheets

(56) References Cited

U.S. PATENT DOCUMENTS

| | | |
|---|---|---|
| 7,209,057 B2 | 4/2007 | Hashido et al. |
| 7,227,542 B2 | 6/2007 | Koyama |
| 7,402,468 B2 | 7/2008 | Park et al. |
| 7,419,858 B2 | 9/2008 | Schuele et al. |
| 7,510,891 B2 | 3/2009 | Chun et al. |
| 7,550,306 B2 | 6/2009 | Park et al. |
| 7,553,707 B2 | 6/2009 | Horino et al. |
| 7,563,669 B2 | 7/2009 | Chittipeddi et al. |
| 7,602,456 B2 | 10/2009 | Tanaka |
| 7,609,342 B2 | 10/2009 | Yang et al. |
| 7,671,939 B2 | 3/2010 | Araki et al. |
| 7,759,857 B2 | 7/2010 | Vaufrey et al. |
| 7,816,677 B2 | 10/2010 | Lee et al. |
| 7,843,130 B2 | 11/2010 | Shimizu et al. |
| 7,855,508 B2 | 12/2010 | Cok et al. |
| 7,919,918 B2 | 4/2011 | Kim |
| 7,952,104 B2 | 5/2011 | Leonardi et al. |
| 7,956,825 B2 | 6/2011 | Kane |
| 7,969,087 B2 | 6/2011 | Hwang et al. |
| 7,973,470 B2 | 7/2011 | Cok |
| 8,053,978 B2 | 11/2011 | Hwang et al. |
| 8,064,028 B2 | 11/2011 | Katayama et al. |
| 8,072,080 B2 | 12/2011 | Moriwaki |
| 8,089,429 B2 | 1/2012 | Yamashita et al. |
| 8,102,338 B2 | 1/2012 | Hwang et al. |
| 8,133,748 B2 | 3/2012 | Yamazaki et al. |
| 8,236,628 B2 | 8/2012 | Liu et al. |
| 8,278,162 B2 | 10/2012 | Akimoto et al. |
| 8,278,661 B2 | 10/2012 | Song |
| 8,294,147 B2 | 10/2012 | Yamazaki et al. |
| 8,297,991 B2 | 10/2012 | Adachi |
| 8,339,531 B2 | 12/2012 | Yamauchi |
| 8,363,197 B2 | 1/2013 | Matsuda et al. |
| 8,368,674 B2 | 2/2013 | Kim et al. |
| 8,377,762 B2 | 2/2013 | Eguchi et al. |
| 8,427,607 B2 | 4/2013 | Lee et al. |
| 8,455,872 B2 | 6/2013 | French |
| 8,471,256 B2 | 6/2013 | Yamazaki et al. |
| 8,508,562 B2 | 8/2013 | Akimoto et al. |
| 8,508,709 B2 * | 8/2013 | Huang et al. .......... 349/192 |
| 8,552,655 B2 | 10/2013 | Ono |
| 8,568,877 B2 | 10/2013 | Ferrari et al. |
| 8,610,860 B2 | 12/2013 | Huang et al. |
| 8,692,743 B2 | 4/2014 | Tsai et al. |
| 8,859,947 B2 | 10/2014 | Adachi |
| 2003/0076282 A1 | 4/2003 | Ikeda et al. |
| 2007/0268229 A1 | 11/2007 | Kang et al. |
| 2008/0252202 A1 | 10/2008 | Li et al. |
| 2009/0102052 A1 | 4/2009 | Ryu |
| 2010/0156771 A1 | 6/2010 | Lee et al. |
| 2010/0330811 A1 | 12/2010 | Nagao |
| 2011/0012125 A1 | 1/2011 | Nicholas |
| 2011/0227850 A1 * | 9/2011 | Oh et al. .......... 345/173 |
| 2012/0087460 A1 | 4/2012 | Moriwaki |
| 2012/0105495 A1 | 5/2012 | Choi |
| 2012/0119211 A1 | 5/2012 | Lin |
| 2012/0205658 A1 | 8/2012 | Yamazaki et al. |
| 2012/0248455 A1 | 10/2012 | Van Gestel |
| 2012/0268396 A1 | 10/2012 | Kim et al. |
| 2012/0287102 A1 | 11/2012 | Toyomura et al. |
| 2012/0299976 A1 | 11/2012 | Chen et al. |
| 2013/0027646 A1 | 1/2013 | Cho et al. |
| 2013/0069061 A1 | 3/2013 | Nakazawa |
| 2013/0161622 A1 | 6/2013 | Lee |
| 2013/0328053 A1 | 12/2013 | Roudbari et al. |
| 2013/0335658 A1 | 12/2013 | Huang et al. |
| 2013/0337596 A1 | 12/2013 | Hung et al. |
| 2014/0061656 A1 | 3/2014 | Yu et al. |
| 2014/0070225 A1 | 3/2014 | Yu et al. |
| 2014/0084292 A1 | 3/2014 | Hung et al. |
| 2014/0103349 A1 | 4/2014 | Yu et al. |
| 2014/0104527 A1 | 4/2014 | Yang et al. |
| 2014/0120657 A1 | 5/2014 | Hung et al. |
| 2014/0203245 A1 | 7/2014 | Gupta et al. |
| 2014/0204067 A1 | 7/2014 | Gupta |
| 2014/0211120 A1 | 7/2014 | Yang et al. |
| 2014/0225117 A1 | 8/2014 | Roudbari et al. |
| 2014/0252317 A1 | 9/2014 | Gupta et al. |

FOREIGN PATENT DOCUMENTS

| | | |
|---|---|---|
| JP | 2010056015 | 3/2010 |
| TW | 201142797 | 12/2011 |
| WO | WO 2011/030620 | 3/2011 |
| WO | WO 2011/151970 | 12/2011 |

* cited by examiner

PROTECTION LAYER FOR HALFTONE PROCESS OF THIRD METAL

TECHNICAL FIELD

Embodiments described herein relate generally to a manufacturing process for a display element, and more particularly to a manufacturing process providing a protection layer for a metal layer of a display pixel, while reducing complexity of the manufacture process.

BACKGROUND

Multi-step mask process flows may be used to manufacture thin-film transistor devices, including thin-film transistors that operate pixels in an electronic display. Pixel thin-film transistors may include a common voltage electrode. This common voltage electrode ($V_{COM}$ electrode) may have a relatively high sheet resistance, which is undesirable.

Accordingly, some pixel thin-film transistors employ a third metal layer to reduce the sheet resistance of the $V_{COM}$ electrode. (Generally, the first and second metal layers correspond to the gate and source/drain of the transistor.) The implementation of a third metal layer may add an additional mask to the process flow, thereby increasing the cost of manufacture and reducing the manufacturing yield. Generally, any increase in the number of masks required to create a transistor has an adverse effect on manufacturing.

The number of masks may be reduced by using a halftone process etch both the common electrode and third metal. However, such a halftone process may result in a loss of thickness in the planarization layer during an ashing process used to remove the photoresist that forms the halftone. This may result in, ultimately, a mis-formed via hole between a pixel conductive upper layer and the source/drain or gate metal. Thus, it may be desirable to protect the planarization layer during manufacturing.

SUMMARY

One embodiment described herein takes the form of a thin-film transistor, comprising: a gate; a gate insulator overlaying the gate; an active layer overlaying the gate insulator; a source/drain overlaying the gate insulator; a first passivation layer overlaying the source/drain; a planarization layer overlaying the first passivation layer; and a protection layer overlaying the planarization layer.

Another embodiment described herein takes the form of a method for forming a thin-film transistor, comprising: forming a via in a planarization layer; depositing a protection layer over the planarization layer; depositing a common electrode layer over the protection layer; depositing a third metal layer over the common electrode layer; etching a portion of the common electrode layer and the metal layer to form a remainder of the metal layer; depositing a second passivation layer over a portion of the protection layer, a portion of the common electrode and the remainder of the metal layer; etching a portion of the second passivation layer, a second portion of the protection layer, a portion of the planarization layer, and a portion of first passivation layer to extend the via to a drain of the thin-film transistor; and coating the via with a conductive material.

These and other embodiments will be more fully understood upon reading the specification in its entirety.

DETAILED DESCRIPTION

Generally, embodiments described herein take the form of a method for manufacturing a display element, through using a protective layer overlying a planarization layer. The finished pixel cross-section, for example, may include a planarization layer overlying a first passivation layer, a source and drain of an associated pixel thin-film transistor (TFT) an active layer of the pixel, a gate insulator, and a gate. The protective layer may overlie the planarization layer at least partially. The planarization layer may be an organic material, such as a photoresist material. In some embodiments, the first passivation layer is optional and may be omitted.

Figure 1:
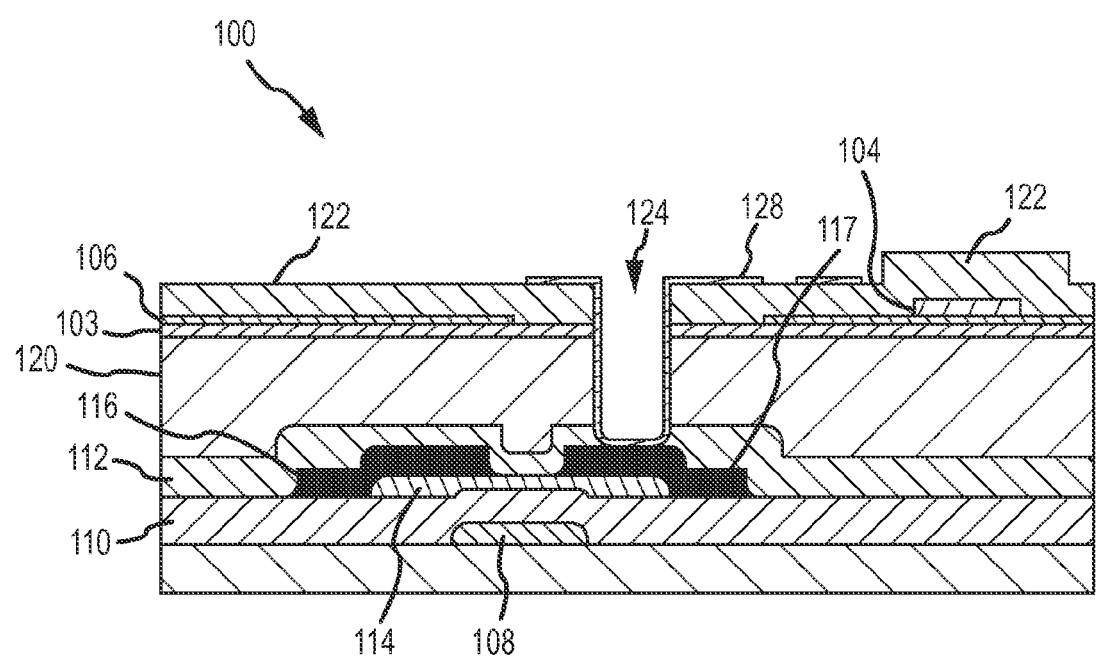
FIG. 1 depicts a schematic cross-section of a thin-film transistor device for a display pixel, in accordance with an embodiment.

Currently, a multi-mask process flow is used to manufacture thin film transistor devices. In the specific context of thin film transistor display panels, this manufacturing process includes making a connection to a $V_{COM}$ signal line that provides a reference for the backplane or back plate of the panel. FIG. 1 is a cross-sectional area of semiconductor device 100 that represents a portion of one sample thin film transistor display panel.

The semiconductor device 100 shown in FIG. 1 may take the form of at least one thin film transistor 100, including a $V_{COM}$ electrode. The TFT 100 and other structures of the device include elements that are located in a first metal layer disposed on a substrate 102. The first metal layer includes a gate 108 for the thin-film transistor 100. The thin-film transistor 100 additionally includes a semiconductor 114 that forms the active layer of the TFT. The semiconductor 114 sits on a gate insulation layer 110, which is disposed on the first metal layer (not shown in FIG. 1). The semiconductor 114 is connected to a source 116 electrode and to a drain 117 electrode, each of which is formed in a second metal layer. The terms "thin film transistor," "TFT," and "semiconductor device" are generally used interchangeably herein.

A via hole 124 provides a connection to the drain 117. As shown in FIG. 1, the via hole 124 extends through a first passivation layer 112, an organic layer 120, and a second passivation layer 122. The via hole 124 makes electrical contact with the drain 117 through a thin film of transparent conducting oxide 128 that is deposited on an interior of the via hole 124.

As mentioned above, the semiconductor device 100 may be a portion of a thin film transistor display panel. In this case, the transistor 100 may implement or otherwise be associated with one of a number of pixels in the display panel. In addition to transistors that implement pixels, a thin film transistor display panel will also typically include a $V_{COM}$ signal line (e.g., electrode). The $V_{COM}$ signal provides a reference for the backplane or back plate of the panel. The semiconductor device 100 shown in FIG. 1 includes a $V_{COM}$ signal line 106 that is routed beneath a third metal layer 104. The third metal layer 104 may function to reduce the sheet resistance of the $V_{COM}$ electrode.

Figure 2:
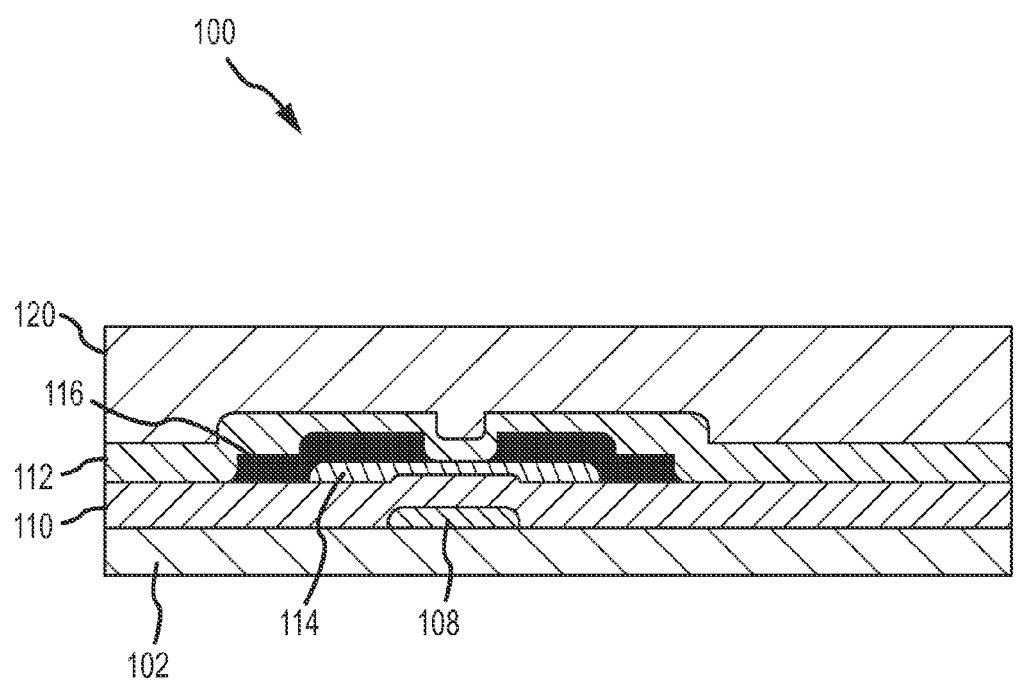
FIG. 2 depicts a schematic cross-section of the thin-film transistor device of FIG. 1 after deposition of a planarization layer.

Generally, manufacture of the pixel TFT up to the planarization layer 120 occurs as known with respect to prior art display pixel TFTs. FIG. 2 depicts the pixel TFT with the planarization layer 120 deposited as the most recent mask step. The planarization layer may be formed from any suitable material, including an organic material. Accordingly, manufacture of the pixel TFT 100, including the use of a protective layer to minimize reduction of the planarization layer during later etching processes, will now be described.

Following deposition of the planarization layer 120 as shown in FIG. 2, the via hole 124 may be formed. Generally, the planarization layer 120 may be formed from an organic material, such as a photoresist material. Accordingly, the via hole 124 may be formed by appropriately masking the planarization layer and then exposing the planarization layer to light. If the planarization layer is formed from a positive photoresist, the area in which the via hole 124 is to be formed will not be masked, but the rest of the planarization layer surface will be masked. When a light source is activated, light impacts the unwanted portion of the planarization layer. The photoresist of the planarization layer is rendered soluble to an etching or developing agent by the light. The rest of the passivation layer is shielded from etching effects by the photoresist. After light exposure, the developing agent is applied to the upper surface of the pixel TFT 100 to remove the soluble portion of the planarization layer.

Figure 3:
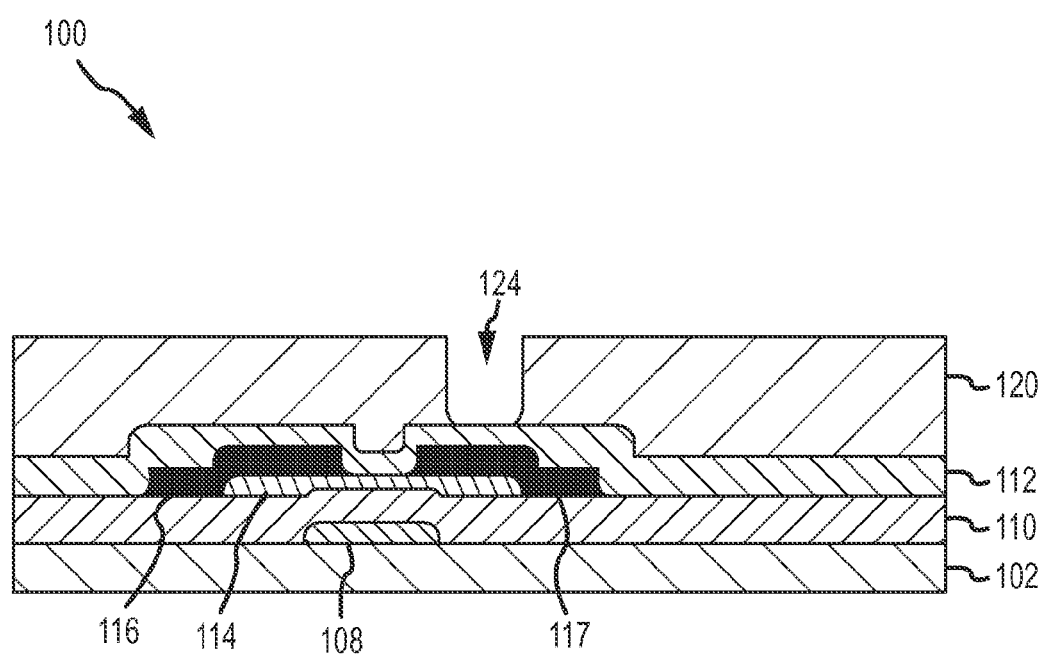
FIG. 3 depicts a schematic cross-section of the thin-film transistor device of FIG. 2 after formation of a via hole.
Figure 4:
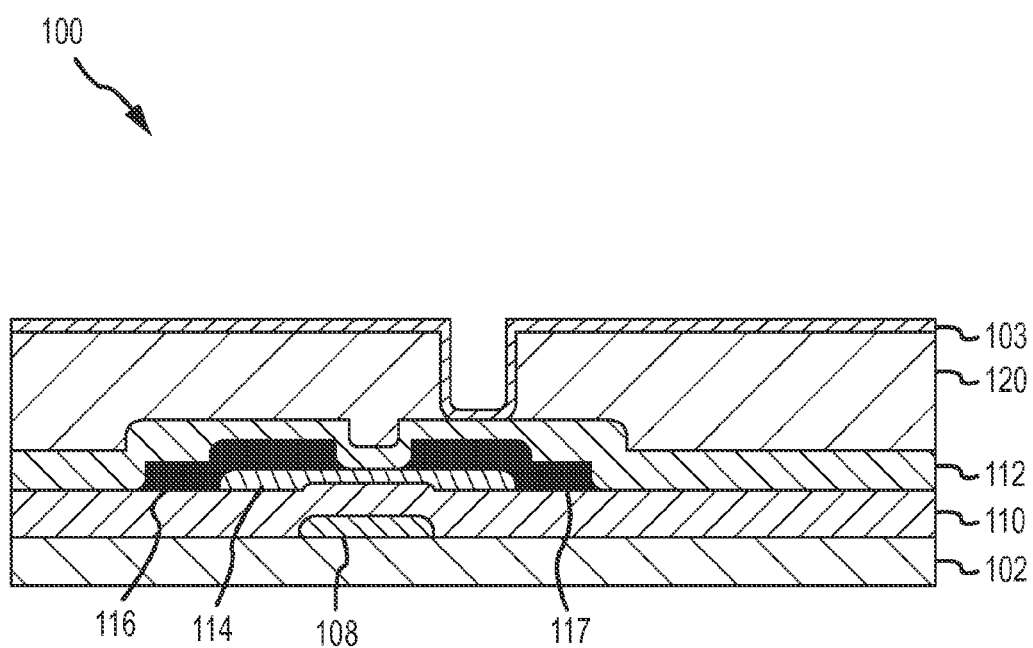
FIG. 4 depicts a schematic cross-section of the thin-film transistor device of FIG. 3 after formation of a protection layer.

The result is that the undesired portion of the planarization layer 120 is consumed. Thus, via hole 124 is formed in a small region of the planarization layer but the rest of the layer remains untouched. This results in the configuration shown in FIG. 3, with the via hole 124 in the planarization layer 120.

What has been described is a positive photoresist. A positive photoresist generally is insoluble to a developing agent initially but becomes soluble when exposed to light. Certain embodiments may use a negative photoresist instead, which begins as soluble to the developing agent, but becomes insoluble when light impacts it. Depending on the type of photoresist chosen, the light may be manipulated accordingly to provide solubility and insolubility where desired. For example, if the planarization layer 120 is formed from a negative photoresist, the area in which the via hole 124 is to be formed may be masked while the rest of the planarization layer surface is not. Thus, after exposure of the planarization layer to light and removal of the mask, the area to be formed into the via hole 124 may remain soluble to an etchant while the rest of the planarization layer will resist etching.

After forming the via hole 124, which provides a connection between the source/drain metal and the pixel ITO layer, a protection layer 103 may be deposited. The protection layer 103 overlies the planarization layer 120 and also the sides and bottom of the via hole 124, forming a continuous coating. As will be discussed below, the protection layer may prevent the planarization layer from being inadvertently etched away during a later mask process. The protection layer may be formed from silicon nitride (SiNx), in some embodiments. In other embodiments, silicon oxide (SiO2) may be used.

Following deposition of the protection layer, the $V_{COM}$ electrode 106 (in the present embodiment, formed from ITO) may be formed atop the protection layer 103. A third metal layer 104 may be deposited on the $V_{COM}$ electrode 106. Next, a photoresist layer 500 may be placed on a portion of the third metal layer. This creates the configuration shown in FIG. 5. The third metal layer and $V_{COM}$ electrode layer also overlie the sides of the via hole 124, as shown in FIG. 5.

Figure 5:
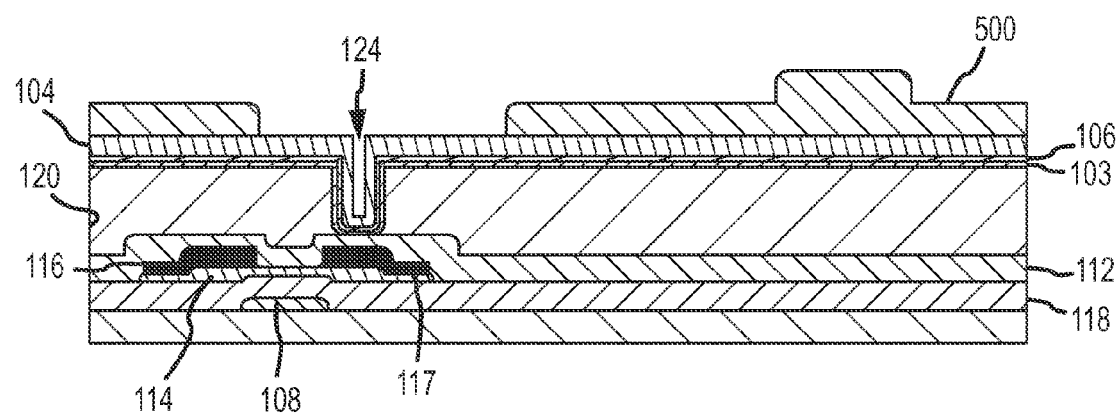
FIG. 5 depicts a schematic cross-section of the thin-film transistor device of FIG. 4 after a common electrode, third metal and photoresist layer have been deposited.

With respect to FIG. 5, it should be noted that the photoresist layer does not cover the via hole 124 or a portion of the third metal 104 around or adjacent the via hole. Further, the photoresist is thicker over a segment of the third metal layer 104 than over other areas (shown to the right-hand side of FIG. 5). The thicker area represents a full photoresist coating, while the thinner photoresist coating areas are a halftone coating. This halftone process will be used to combine the mask for the third metal layer 104 and $V_{COM}$ electrode 106 as shown previously with respect to FIG. 1. The etching of the third metal layer will be discussed later.

Figure 6:
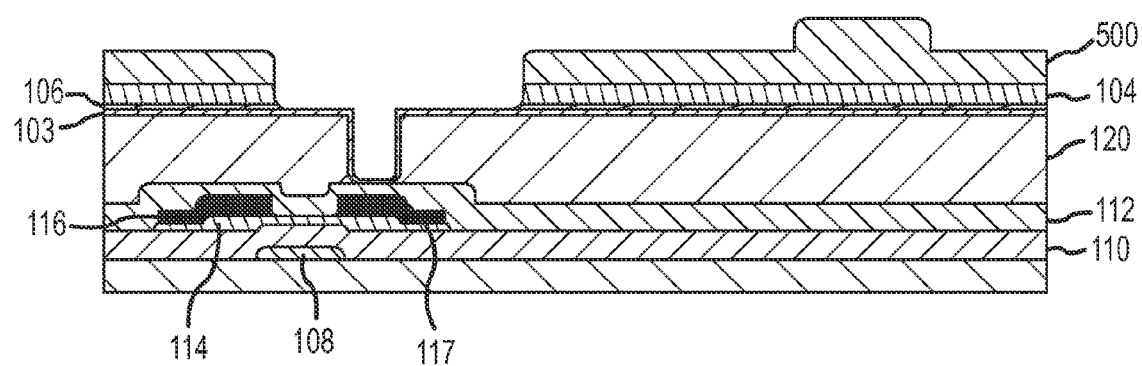
FIG. 6 depicts a schematic cross-section of the thin-film transistor device of FIG. 5 after an etching process.

Next, the third metal layer 104 and $V_{COM}$ electrode layer 106 are etched away in the areas not covered by the photoresist, thus removing these layers in those areas. This etching process removes the third metal layer and $V_{COM}$ electrode layer from the via hole 124. The etching is stopped by the protection layer, which is insoluble to the etching process. Thus, the planarization layer 120 is not etched away when the third metal and electrode layers are removed. Without the protection layer 103, the planarization layer 120 may be affected by the etching process. The results of the etching operation are shown in FIG. 6. The etching process does not affect the photoresist layer 500, as also shown in FIG. 6.

Figure 7:
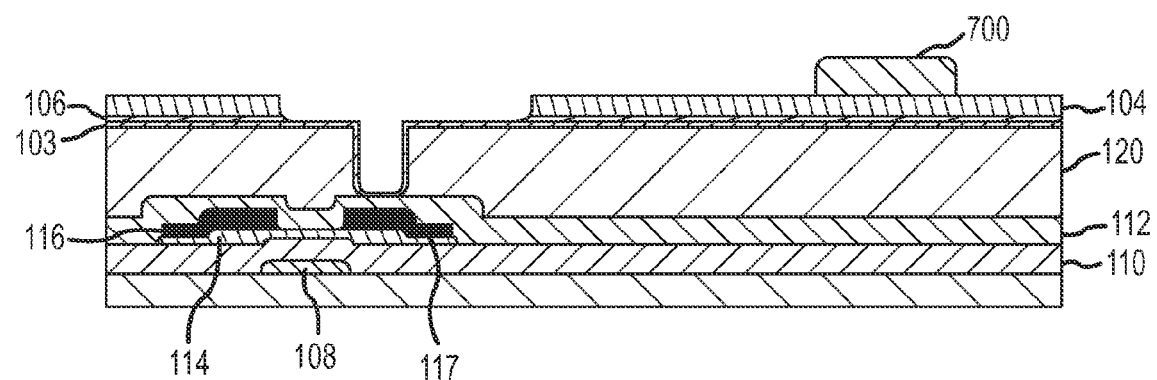
FIG. 7 depicts a schematic cross-section of the thin-film transistor device of FIG. 6 after an ashing process.

An ashing process is now performed. The ashing process removes the photoresist layer 500 in the halftone regions but leaves a small photoresist deposit 700 at one location above the third metal layer 104. Without the protection layer 103, the planarization layer 120 may be affected by the ashing process. FIG. 7 depicts the pixel TFT cross-section after ashing.

Figure 8:
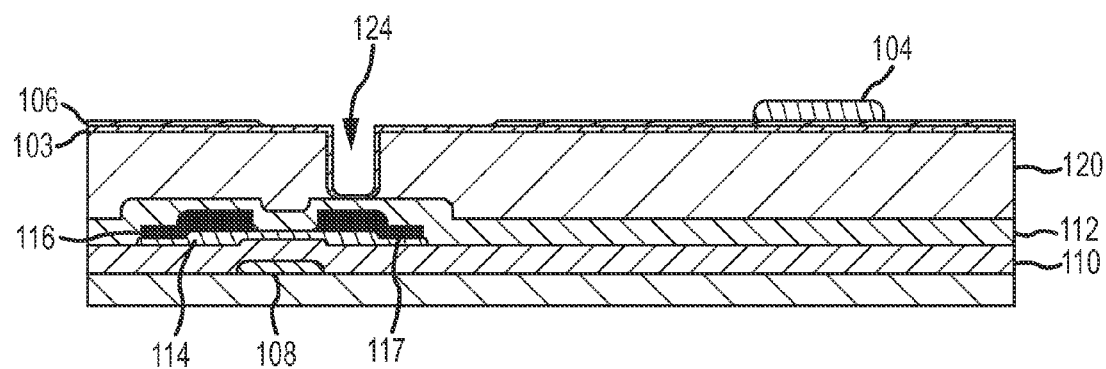
FIG. 8 depicts a schematic cross-section of the thin-film transistor device of FIG. 7 after another etching process acting on the third metal layer.

Next, the third metal layer 104 is etched. The etching removes the third metal anywhere it is not protected by photoresist deposit 700. The photoresist deposit 700 may also be removed. Following etching of the third metal layer, the third metal 104 is exposed, a portion of the $V_{COM}$ electrode 106 is exposed, and the protection layer 103 is exposed around and along the sidewalls of the via hole 124. This configuration is depicted in FIG. 8.

Figure 9:
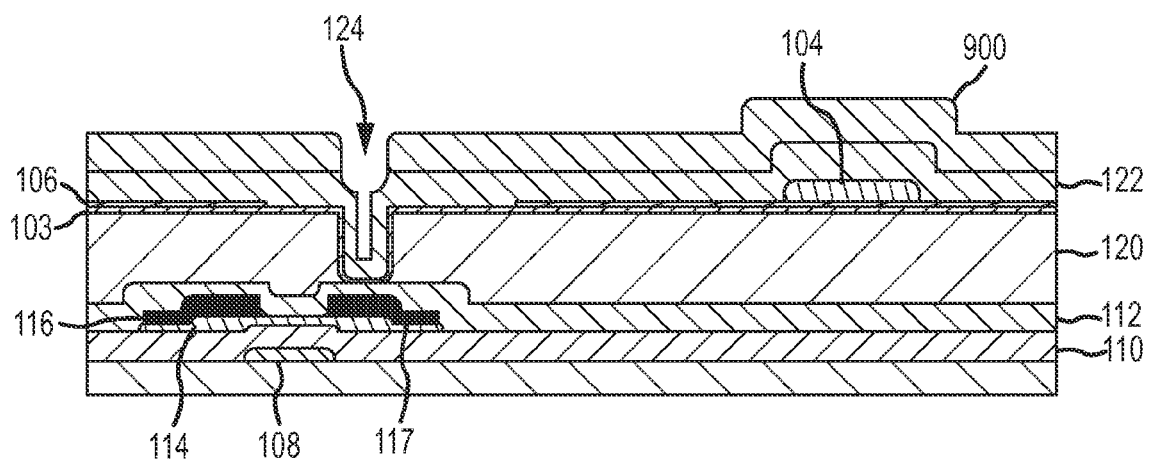
FIG. 9 depicts a schematic cross-section of the thin-film transistor device of FIG. 8 after deposition of a second passivation layer and a photoresist layer.

Following the third metal etching process, a second passivation layer 122 may be formed atop portions of the third metal 104, $V_{COM}$ electrode 106 and protection layer 103. The second passivation layer 122 may extend into the via hole 124. Next, a photoresist layer 900 may be deposited on the second passivation layer 122, except in the area of the second passivation layer corresponding to the via hole 124. FIG. 9 depicts a cross-section of the pixel TFT showing the second passivation layer 122 and photoresist layer 900. A single mask may be used to pattern the passivation layer.

Given the foregoing, an etching process may be performed to form the via hole 124 into its final shape and depth. This etching process may extend the via hole 124 to abut the source/drain layer 117. The etching process may be a dry etch, in some embodiments. Generally, the etchant removes the first passivation layer 112, the protection layer 103 and the second passivation layer 122. The etchant may act on all three layers because, in some embodiments, all may be formed from SiNx or SiO2. One mask may be used to pattern all three layers.

Figure 10:
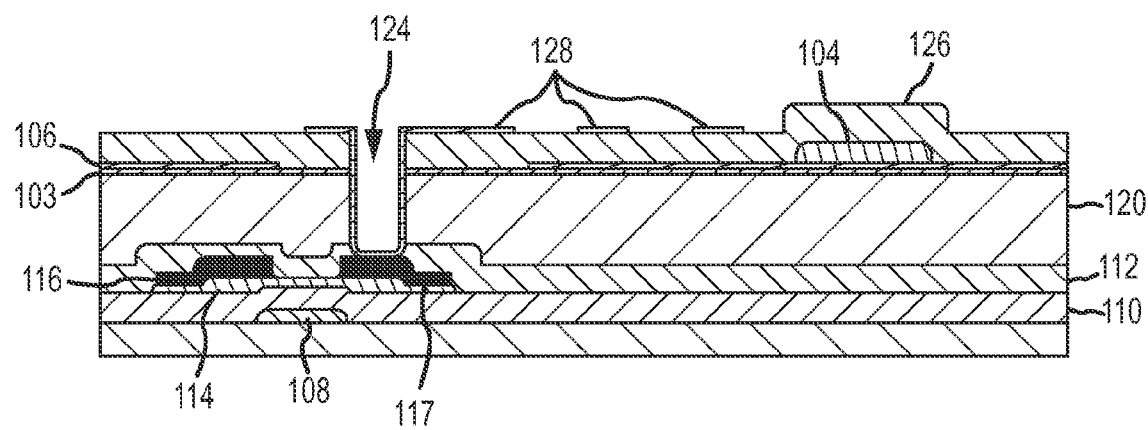
FIG. 10 depicts a schematic cross-section of the thin-film transistor device of FIG. 9 after another etching process.

The etchant is generally ineffective against metal, and so stops etching once it reaches the source/drain metal layer. This finally forms the via hole 124 and establishes the hole as reaching to the source/drain metal layer. The pixel electrode 128 (ITO or another suitable conductive material) may be deposited in the via hole 124. This permits electrical contact with the drain 117 through the thin film of transparent conducting material 128 that is deposited on an interior of the via hole 124. This configuration is shown generally in FIG. 10. The pixel electrode 128 may be patterned through use of another mask.

The pixel electrode 128 may serve as a bridge between the source/drain metal and the $V_{COM}$ electrode 106. (This connection is not visible in the cross-section of FIG. 10). [Accordingly, the planarization layer may be protected from negative impacts of manufacturing operations while a via hole 124 is still provided between the upper layers of the pixel TFT and the source/drain metal. The final cross-section of the pixel TFT is that shown in FIG. 1 and discussed above.

As previously mentioned, several of the layers may be formed from silicon nitride or silicon oxide. For example, in some embodiments, each of the second passivation layer, protection layer and first passivation layer may be silicon nitride or silicon oxide. In one embodiment, the first and second passivation layers may be approximately from 500 to 3000 Angstroms thick, while the protection layer is approximately 50-2000 Angstroms thick. In certain embodiments, the protection layer may be 100-500 Angstroms thick. Thus, the protection layer may be sufficiently thick to prevent an ashing process from damaging the planarization layer, but need not add great thickness to the overall cross-section of the TFT structure 100.

In alternative embodiments, the common electrode layer 106 may overlie the third metal layer 104. That is, the $V_{COM}$ electrode and third metal may switch places in the pixel TFT stackup. In such embodiments, it may not be necessary to employ the halftone process described herein to form the third metal layer 104; the halftone may be omitted.

Although embodiments have been described herein with respect to certain physical structures and processes, it should be appreciated that alternative embodiments may add to, omit or alter both structures and processes without departing from the spirit and scope of this disclosure. Accordingly, the proper scope of protection is set forth in the following claims.

We claim:
1. A method for forming a thin-film transistor, comprising:
forming a via in a planarization layer;
depositing a protection layer over the planarization layer;
depositing a common electrode layer over the protection layer;
depositing a metal layer over the common electrode layer;
etching a portion of the common electrode layer and the metal layer to form a remainder of the metal layer;
depositing a passivation layer over a portion of the protection layer, a portion of the common electrode and the remainder of the metal layer;
etching a portion of the passivation layer and a second portion of the protection layer; and
coating the via with a conductive material.
2. The method of claim 1, further comprising:
forming, with the conductive material, an electrical connection between the pixel electrode layer and a drain.
3. The method of claim 1, wherein the operations of patterning a common electrode layer and a metal layer are performed with a single mask.
4. The method of claim 1, wherein the etching of the passivation layer and the second portion of the protection layer, occurs as part of a single etching process.
5. The method of claim 1, wherein the protection layer is formed from one of silicon nitride and silicon oxide.
6. The method of claim 5, wherein each of the passivation layer and the protection layer are formed from the same material.
7. The method of claim 6, wherein the protection layer is from 50-2000 Angstroms thick.
8. The method of claim 6, wherein the protection layer is from 100-500 Angstroms thick.
9. The method of claim 1, wherein the protection layer protects the planarization layer during the operation of at least one of photoresist ashing for single mask process of the common electrode and the metal layer, or etching a portion of the common electrode layer and the metal layer to form a remainder of the metal layer.
10. A method for forming a thin-film transistor, comprising:
forming a via in a planarization layer, the planarization layer overlaying a first passivation layer;
depositing a protection layer over the planarization layer;
depositing a metal layer over the protection layer;
depositing a common electrode layer over the metal layer;
etching a portion of the common electrode layer and the metal layer to form a remainder of the metal layer;
depositing a second passivation layer over a portion of the protection layer, a portion of the common electrode and the remainder of the metal layer; and
etching a portion of the second passivation layer, a second portion of the protection layer, and a portion of the first passivation layer to extend the via to a drain of the thin-film transistor.

\* \* \* \* \*